(12) United States Patent
Takegoshi et al.

(10) Patent No.: US 8,013,608 B2
(45) Date of Patent: Sep. 6, 2011

(54) HIGH-RESOLUTION NMR PROBE

(75) Inventors: Kiyonori Takegoshi, Kyoto (JP);
Takashi Mizuno, Kyoto (JP)

(73) Assignee: JEOL Resonance Inc., Tokyo (JP)

( * ) Notice: Subject to any disclaimer, the term of this patent is extended or adjusted under 35 U.S.C. 154(b) by 167 days.

(21) Appl. No.: 12/487,871

(22) Filed: Jun. 19, 2009

(65) Prior Publication Data

US 2010/0321018 A1    Dec. 23, 2010

(51) Int. Cl.
*G01V 3/00* (2006.01)
(52) U.S. Cl. .................................. 324/321; 324/318
(58) Field of Classification Search .................. 324/321, 324/322, 318
See application file for complete search history.

(56) References Cited

U.S. PATENT DOCUMENTS

| 5,247,256 | A | * | 9/1993 | Marek | 324/321 |
| 7,282,919 | B2 | | 10/2007 | Doty et al. | |
| 7,358,736 | B2 | * | 4/2008 | Fukuda et al. | 324/321 |
| 7,701,212 | B2 | * | 4/2010 | Fukuda et al. | 324/318 |

* cited by examiner

*Primary Examiner* — Louis Arana
(74) *Attorney, Agent, or Firm* — The Webb Law Firm (57) ABSTRACT

A high-resolution NMR probe is offered which is simple in structure and can be fabricated at low cost. The inside of the probe is maintained in a vacuum to adiabatically isolate the inside from the outside. Liquid helium is sent into a first heat exchanger located immediately close to a measurement portion via the innermost region of a triple tube placed in the vacuum. The helium is evaporated in the exchanger to cool a transmit-receive coil and a variable capacitor. The evaporated helium gas is returned via the outermost region of the triple tube. At this time, a radiation shield placed in the vacuum is cooled by a second heat exchanger placed in the return path.

11 Claims, 9 Drawing Sheets

HIGH-RESOLUTION NMR PROBE

BACKGROUND OF THE INVENTION

1. Field of the Invention

The present invention relates to a high-resolution NMR probe and, more particularly, to a high-resolution NMR probe capable of measuring solid samples at higher sensitivity than heretofore.

2. Description of Related Art

An NMR spectrometer is an instrument for analyzing the molecular structure of a sample under investigation by placing the sample in a static magnetic field, irradiating the sample with an RF signal, detecting a feeble RF signal (NMR signal) emanating from the sample, and extracting information about the molecular structure contained in the detected signal.

Figure 1:
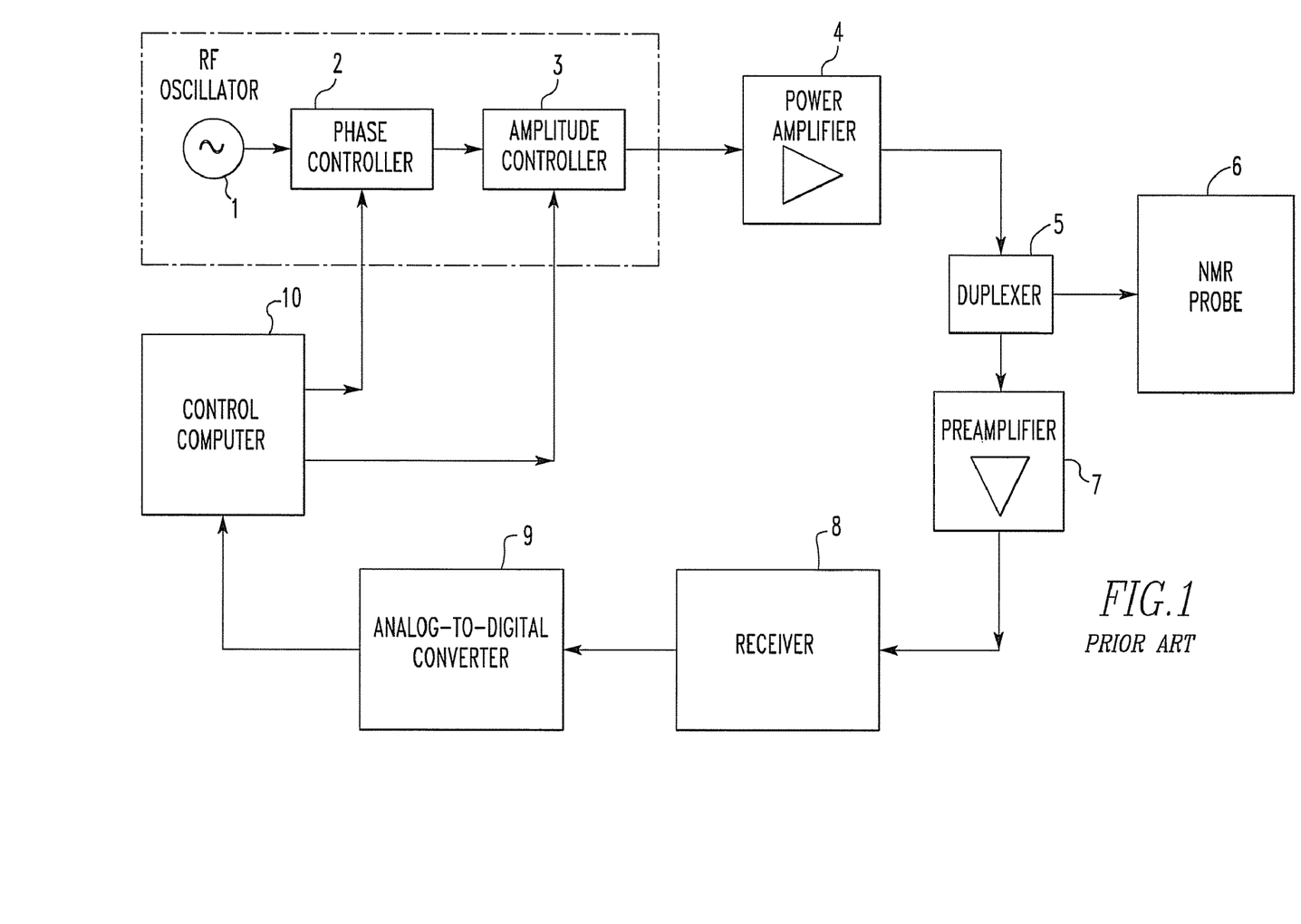
FIG. 1 is a block diagram of one example of the prior art NMR spectrometer.

FIG. 1 schematically shows the structure of an NMR spectrometer. This instrument has an RF oscillator 1 producing an RF signal, which is controlled in terms of phase and amplitude by a phase controller 2 and an amplitude controller 3 and sent to a power amplifier 4.

The power amplifier 4 amplifies the RF signal to a level necessary to excite an NMR signal. The output signal from the amplifier 4 is sent via a duplexer 5 to an NMR probe 6 in which a detection coil (not shown) is placed. The detection coil directs an RF signal to a sample under investigation. After the irradiation, a feeble NMR signal emanating from the sample is detected by the detection coil (not shown) placed in the NMR probe 6. The signal is again passed through the duplexer 5 and then fed to a preamplifier 7, which, in turn, amplifies the signal to a receivable level.

A receiver 8 converts the frequency of the RF NMR signal amplified by the preamplifier 7 to an audio frequency at which the signal can be converted into digital form. Simultaneously, the receiver 8 controls the amplitude. The audio NMR signal from the receiver 8 is converted into digital form by an analog-to-digital data converter 9 and fed to a control computer 10.

The control computer 10 controls the phase controller 2 and amplitude controller 3, Fourier-transforms the NMR signal accepted in the time domain, automatically corrects the phase of the Fourier-transformed NMR signal, and then displays the NMR signal as an NMR spectrum.

Generally, NMR spectroscopy has the problem that the amounts of energies released and absorbed are much smaller than in visible light spectroscopy, UV spectroscopy, and IR spectroscopy because NMR spectroscopy is performed in the radio wave frequency range and, therefore, the detection sensitivity is quite low.

A method conventionally adopted to solve this problem is disclosed in U.S. Pat. No. 7,282,919. In particular, various components within an NMR probe (i.e., transmit-receive coil, preamplifier, tuning and matching circuit, etc.) are cooled cryogenically to remove their electrical thermal noise, for achieving higher sensitivity.

In the conventional method, liquid helium and liquid nitrogen are used in conjunction to cool the transmit-receive coil, preamplifier, tuning and matching circuit, etc. Alternatively, a multistage GM (Gifford-McMahon) refrigerator is used to cool those components. Consequently, the cooling structure is complex and expensive to fabricate.

SUMMARY OF THE INVENTION

In view of the foregoing, it is an object of the present invention to provide a high-resolution NMR probe which is simple in structure and economical to fabricate.

A high-resolution NMR probe that achieves the object in accordance with the teachings of the present invention has: a sample portion placed in a normal-temperature, atmospheric-pressure region and placing a sample in a static magnetic field; a cylindrical partition wall isolated from the normal-temperature, atmospheric-pressure region and having an interior that is maintained in a vacuum; a transmit-receive coil placed within the partition wall and acting to irradiate the sample with an RF magnetic field and to receive an NMR signal emanating from the sample after the irradiation such that the NMR signal is detected as an induced electromotive force; a preamplifier placed within the partition wall and amplifying the NMR signal detected by the transmit-receive coil; a liquid transport tube placed within the partition wall and transporting liquid helium from the outside into vicinities of an NMR measurement portion; a first heat exchanger placed within the partition wall and having a liquid helium reservoir for holding the liquid helium transported by the liquid transport tube, the heat exchanger acting to cool the transmit-receive coil by an amount of heat taken away (latent heat) when the liquid helium held in the liquid helium reservoir evaporates; a gas transport tube placed within the partition wall and returning the helium evaporated by the first heat exchanger to the outside from vicinities of the NMR measurement portion; a radiation shield placed within the partition wall, surrounding the liquid transport tube and the gas transport tube, and being disposed to block radiation heat coming from the outside; and a second heat exchanger placed within the partition wall, mounted in the gas transport tube, and cooling the radiation shield by an amount of heat taken away (latent heat) when the temperature of the evaporated helium rises.

In one feature of the high-resolution NMR probe, the preamplifier is in thermal contact with the first heat exchanger.

In another feature of the high-resolution NMR probe, the preamplifier is in thermal contact with the second heat exchanger.

In a further feature of the high-resolution NMR probe, the partition wall that isolates the atmospheric-pressure region from the vacuum region is made of glass fiber-reinforced plastic.

In yet another feature of the high-resolution NMR probe, the sample portion is a sample-rotating system that rotates the sample at high speed when the sample is a solid sample while tilting it by a magic angle relative to the direction of the static magnetic field.

In still another feature of the high-resolution NMR probe, the liquid transport tube and the gas transport tube together form a triple tubular structure in which the liquid transport tube is located in the innermost region, a vacuum layer forms an intermediate region, and the gas transport tube is located in the outermost region.

In an additional feature of the high-resolution NMR probe, the first heat exchanger can cool down to 10 K or below.

In an additional feature of the high-resolution NMR probe, the second heat exchanger can cool down to 50 K.

In an additional feature of the high-resolution NMR probe, the transmit-receive coil is in thermal contact with the first heat exchanger via a flexible heat link.

In an additional feature of the high-resolution NMR probe, the preamplifier is in thermal contact with the first heat exchanger via a metallic thermal conductive member.

In an additional feature of the high-resolution NMR probe, the vacuum is at a vacuum level of about $10^{-7}$ Torr at which thermal conduction of gas is not prevalent.

A high-resolution NMR probe according to the present invention has: a sample portion placed in a normal-temperature, atmospheric-pressure region and placing a sample in a static magnetic field; a cylindrical partition wall isolated from the normal-temperature, atmospheric-pressure region and having an interior that is maintained in a vacuum; a transmit-receive coil placed within the partition wall and acting to irradiate the sample with an RF magnetic field and to receive an NMR signal emanating from the sample after the irradiation such that the NMR signal is detected as an induced electromotive force; a preamplifier placed within the partition wall and amplifying the NMR signal detected by the transmit-receive coil; a liquid transport tube placed within the partition wall and transporting liquid helium from the outside into vicinities of an NMR measurement portion; a first heat exchanger placed within the partition wall and having a liquid helium reservoir for holding the liquid helium transported by the liquid transport tube, the first heat exchanger acting to cool the transmit-receive coil by an amount of heat taken away (latent heat) when the liquid helium held in the liquid helium reservoir evaporates; a gas transport tube placed within the partition wall and returning the helium evaporated by the first heat exchanger to the outside from vicinities of the NMR measurement portion; and a radiation shield placed within the partition wall, surrounding the liquid transport tube and the gas transport tube, and being disposed to block radiation heat coming from the outside; a second heat exchanger placed within the partition wall, mounted in the gas transport tube, and cooling the radiation shield by an amount of heat taken away (latent heat) when the temperature of the evaporated helium rises. Consequently, a high-resolution NMR probe can be offered which is simple in structure and can be fabricated at low cost.

Other features and advantages of the present invention will become apparent from the following more detailed description, taken in conjunction with the accompanying drawings, which illustrate, by way of example, the principles of the invention.

DESCRIPTION OF THE PREFERRED EMBODIMENTS

The preferred embodiments of the present invention are hereinafter described with reference with the accompanying drawings.

Embodiment 1

Figure 2:
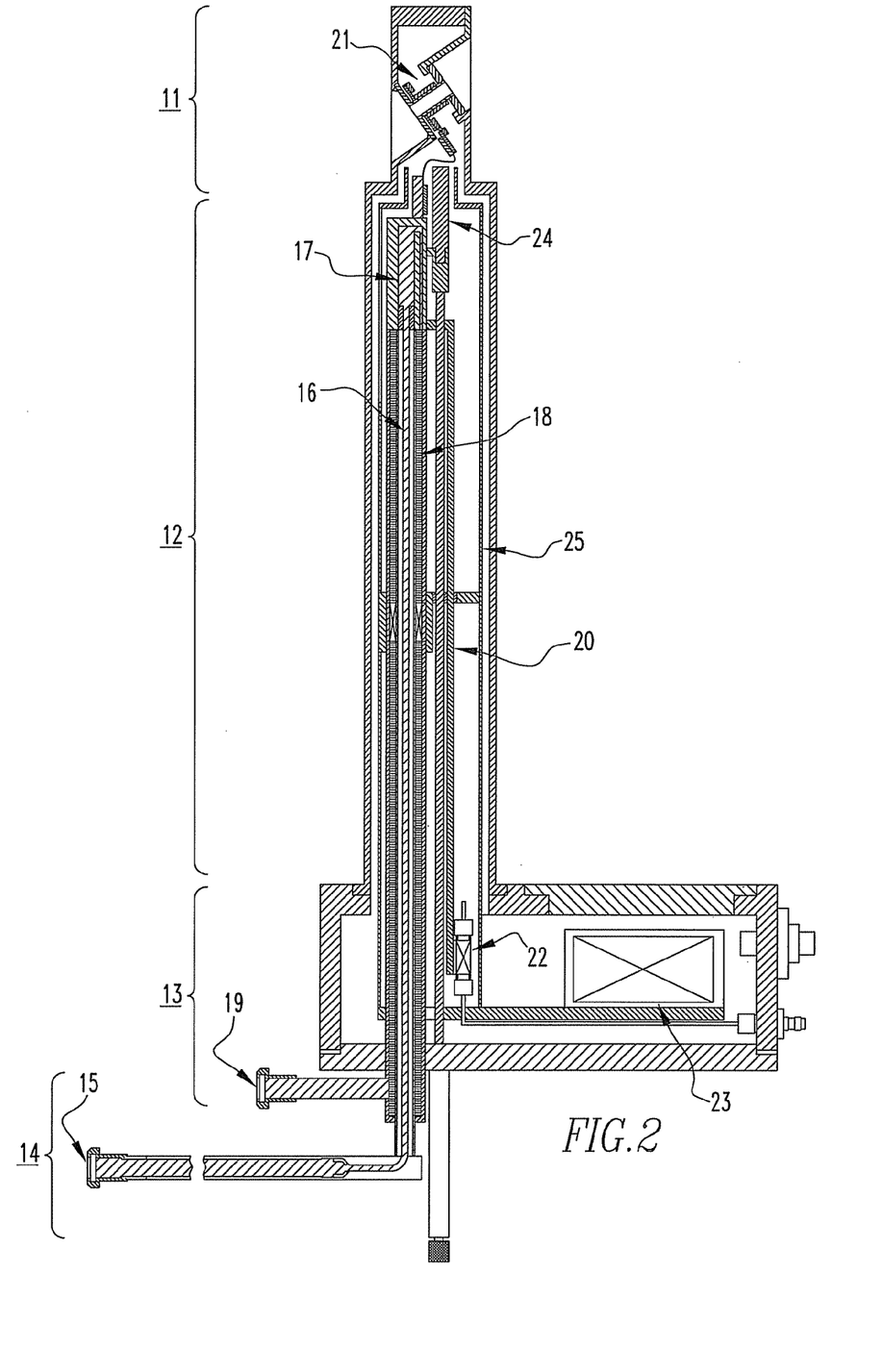
FIG. 2 is a cross-sectional view of the whole structure of a solid-sample, high-resolution NMR probe associated with the present invention.

FIG. 2 shows one embodiment of the invention in which the invention is applied to a high-resolution NMR probe adapted for investigation of solid samples. The probe is composed of four major components: detection portion 11, relay portion 12, electrical circuitry 13, and refrigerant inlet-outlet portion 14.

The detection portion 11 applies an RF magnetic field to a sample while rotating a sample tube at high speed, the tube being used for NMR measurements on solids. The detection portion 11 has a transmit-receive coil 21 for detecting an NMR signal emanating from the sample after it is irradiated with the RF magnetic field.

The relay portion 12 places the detection portion 11 in position within a bore (vertical hole) formed in a superconducting magnet (not shown). The relay portion 12 is elongated to permit the detection portion 11 to be placed within the strong static magnetic field produced by the superconducting magnet.

The electrical circuitry 13 incorporates a preamplifier 22 located at the lower end of the relay portion 12 and amplifying an NMR signal detected by the transmit-receive coil 21 and a transmission-reception switching circuit 23 for tuning and matching the coil 21 and an external RF circuit (not shown).

The refrigerant inlet-outlet portion 14 introduces refrigerant, such as liquid helium, for cryogenically cooling the transmit-receive coil 21, preamplifier 22, transmission-reception switching circuit 23, a tuning-and-matching variable capacitor 24, and so on into the NMR probe or discharges the refrigerant from the NMR probe.

The inside of the high-resolution probe used for investigation of solid samples is maintained in a vacuum of the order of $10^{-7}$ Torr at which thermal conduction of gas is not prevalent. The spaces among structural members within the probe are adiabatically isolated from each other by a vacuum layer. The shielding wall between the vacuum layer and the outside air is made of glass fiber-reinforced plastic.

Some components are cooled by a method described below. First, liquid helium of 4 K is injected into the NMR probe from a liquid helium injection port 15. The injected helium passes through a liquid helium transport pipe 16 in the relay portion 12 and is sent to a liquid helium reservoir 17 located at the top of the relay portion, the reservoir 17 being immediately under the detection portion. When the liquid helium vaporizes within the liquid helium reservoir 17, heat of vaporization is taken away. As a result, the preamplifier 22 in the electrical circuitry 13 is cooled close to 4 K via the transmit-receive coil 21 of the detection portion 11, tuning-and-matching variable capacitor 24, and a 4 K stage bar 20 which are in thermal contact with the liquid helium reservoir 17.

The evaporated, low-temperature helium gas passes through a helium gas return pipe 18 and is sent to a helium gas exit 19. The return pipe 18 coaxially surrounds the outer surface of the helium transport pipe 16 in the relay portion 12 via the vacuum layer. On its way to the gas exit, the returning helium gas cools a 50 K radiation shield 25 and the transmission-reception switching circuit 23 close to 50 K. The shield 25 is mounted to block radiation heat from the outside and tubularly surrounds the helium transport pipe 16, helium gas return pipe 18, and preamplifier 22. In this way, the helium transport pipe 16 passing through the relay portion 12 and the 4 K stage bar 20 for cooling the preamplifier 22 are prevented from being warmed by radiation heat from the outside.

Figure 3A:
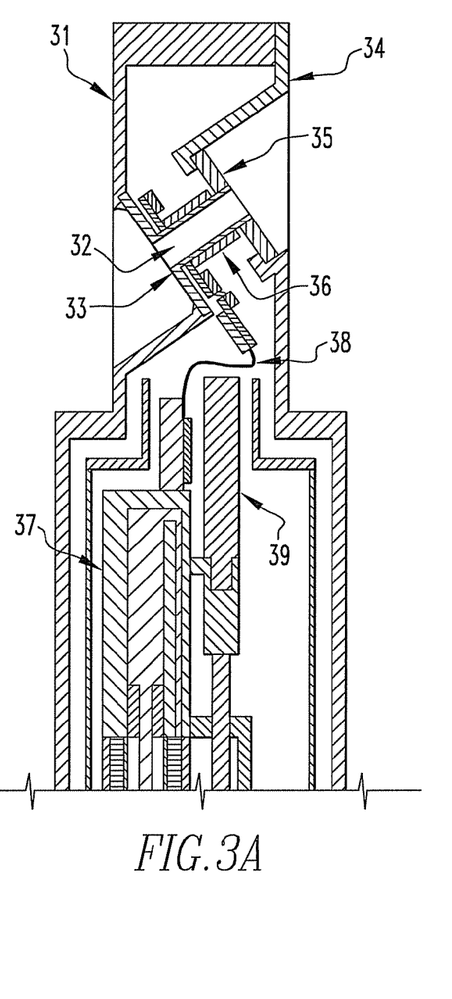
FIGS. 3A, 3B, and 3C show fragmentary enlarged views of the solid-sample, high-resolution NMR probe shown in FIG. 2.
Figure 3B:
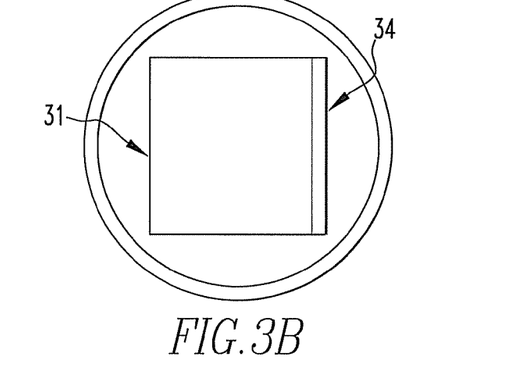
Figure 3C:
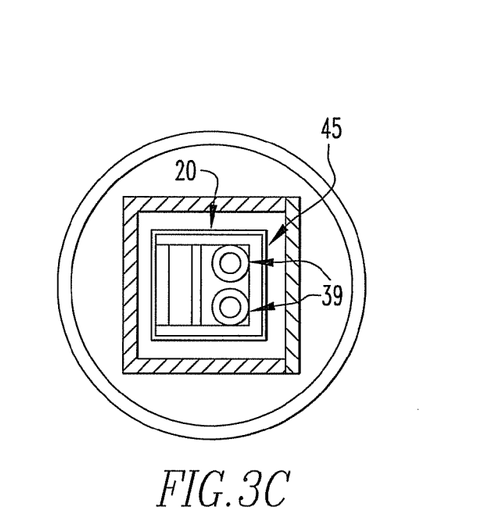

FIGS. 3A, 3B, and 3C show cross sections of the detection portion 11 and its vicinities. FIG. 3B is a plan view taken from above. FIG. 3C is a plan view when the detection portion 11 has been removed.

A jacket 31 is a partition wall isolating an atmospheric-pressure, room-temperature space in the outermost region from the vacuum layer. The jacket 31 assumes the form of a cylinder in the probe relay portion 12 and the form of a rectangular pipe in the probe detection portion 11. The jacket 31 is made of glass fiber-reinforced plastic. In the detection portion 11, the axis of rotation of the sample is set to be identical with the direction defined by the magic angle. To permit a sample-rotating system to be introduced, a cylinder whose axis is tilted by the magic angle relative to the plane of the rectangular pipe is stuck.

The center of the magnetic field is indicated by 32. The center 32 corresponds to the center position of the homogeneous static magnetic field that is substantially in the center of a bore formed in the superconducting magnet. A solid sample is placed in this position. The sample-rotating system is omitted in this figure.

A pipe 33 that isolates the space of the sample from the vacuum layer is a partition wall made of a ceramic. The pipe 33 is adhesively bonded to the jacket 31.

A cover 34 is provided over the jacket 31. In the same way as the jacket 31, to permit the sample-rotating system to be introduced, a cylinder whose axis is tilted by the magic angle relative to a plane is stuck.

A disk-like cover 35 is inserted into the cylindrical portion of the jacket cover 34 and plugs up the gap between the cover 34 and pipe 33.

A transmit-receive coil (sample coil) 36 applies an RF magnetic field to a solid sample and simultaneously detects an electromotive force induced by magnetization of the sample. The transmit-receive coil 36 of the solenoid type is so placed that its axis is parallel to the direction of axis of the sample tube. The direction of the axis is tilted at a magic angle of 54.74° relative to the external static magnetic field.

The liquid helium reservoir 17 is formed in a first heat exchanger 37. When liquid helium vaporizes in the reservoir 17, heat of vaporization is taken away. As a result, the surroundings are cooled. The transmit-receive coil 36 is in thermal contact with the first heat exchanger 37 via an insulator bobbin and a flexible heat link 38 and cooled by thermal conduction. Similarly, a variable capacitor 39 for adjusting the resonant frequency of the transmit-receive coil 36 close to the frequency of the NMR signal from the sample is cooled by thermal conduction performed with the first heat exchanger 37 via a metallic thermal conductive member (such as a copper plate). A cryogenic variable capacitor available from Voltronics Corporation is used as the variable capacitor 39.

Figure 4:
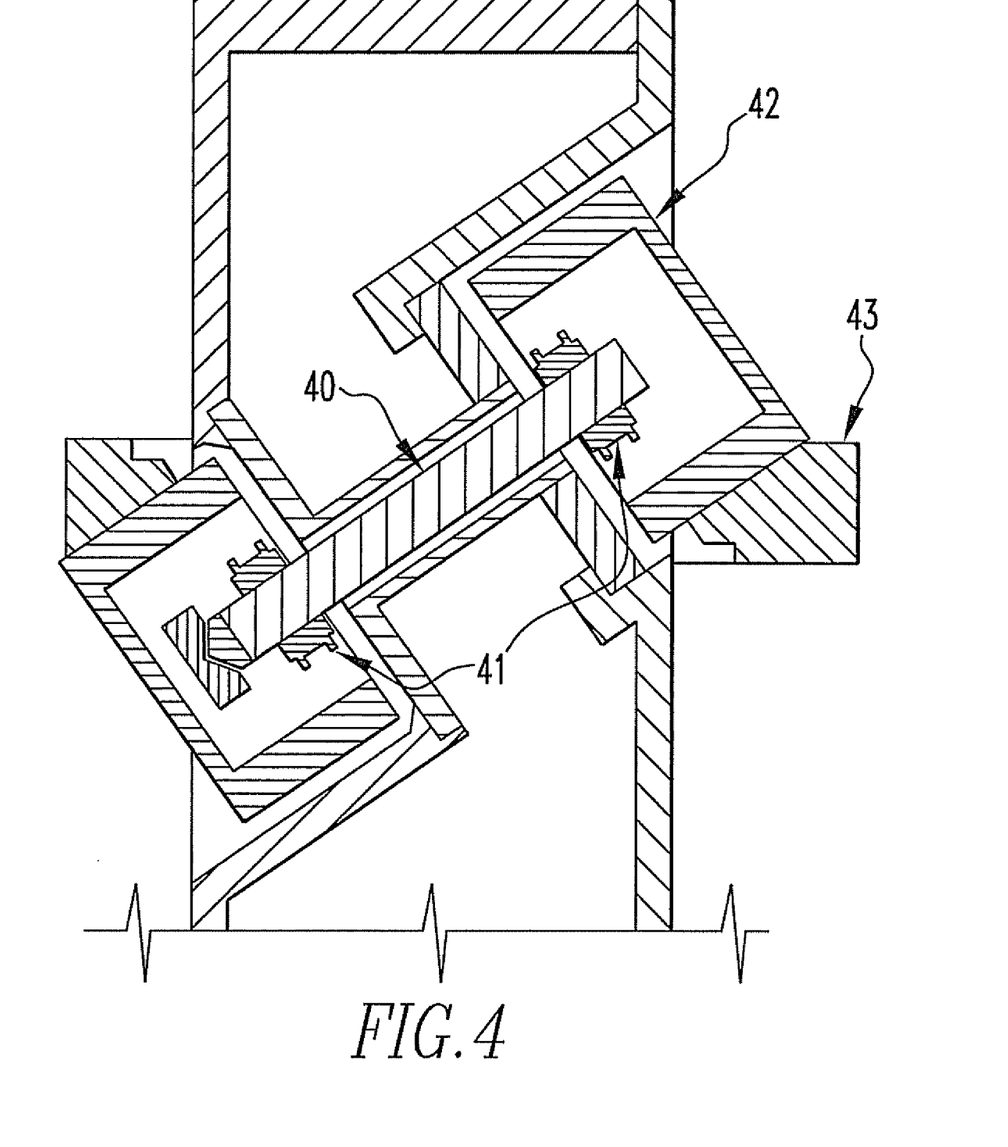
FIG. 4 is a fragmentary enlarged view of the solid-sample, high-resolution NMR probe associated with the present invention.

FIG. 4 is an enlarged view of the sample-rotating system and its vicinities. The dimensions of the various parts are so determined that they are operably accommodated in a restricted space in the form of a circular cylinder having a diameter of 70 mm within a wide-bore superconducting magnet, room-temperature shim coil.

In a normal sample-rotating system, upper and lower air bearings are held by a set of support members. In the case of a cryogenic high-resolution, solid-sample NMR probe, the space in which the transmit-receive coil 36 is entered is a vacuum layer. Therefore, it is impossible that the prior art structure is used unchanged. Accordingly, upper and lower air bearings 41 supporting a solid-sample sample tube 40 are held to their respective adapters mounted in support members 42. The bearings and adapters are coupled together with mounting rings 43 and fixedly mounted to the probe.

Figure 5:
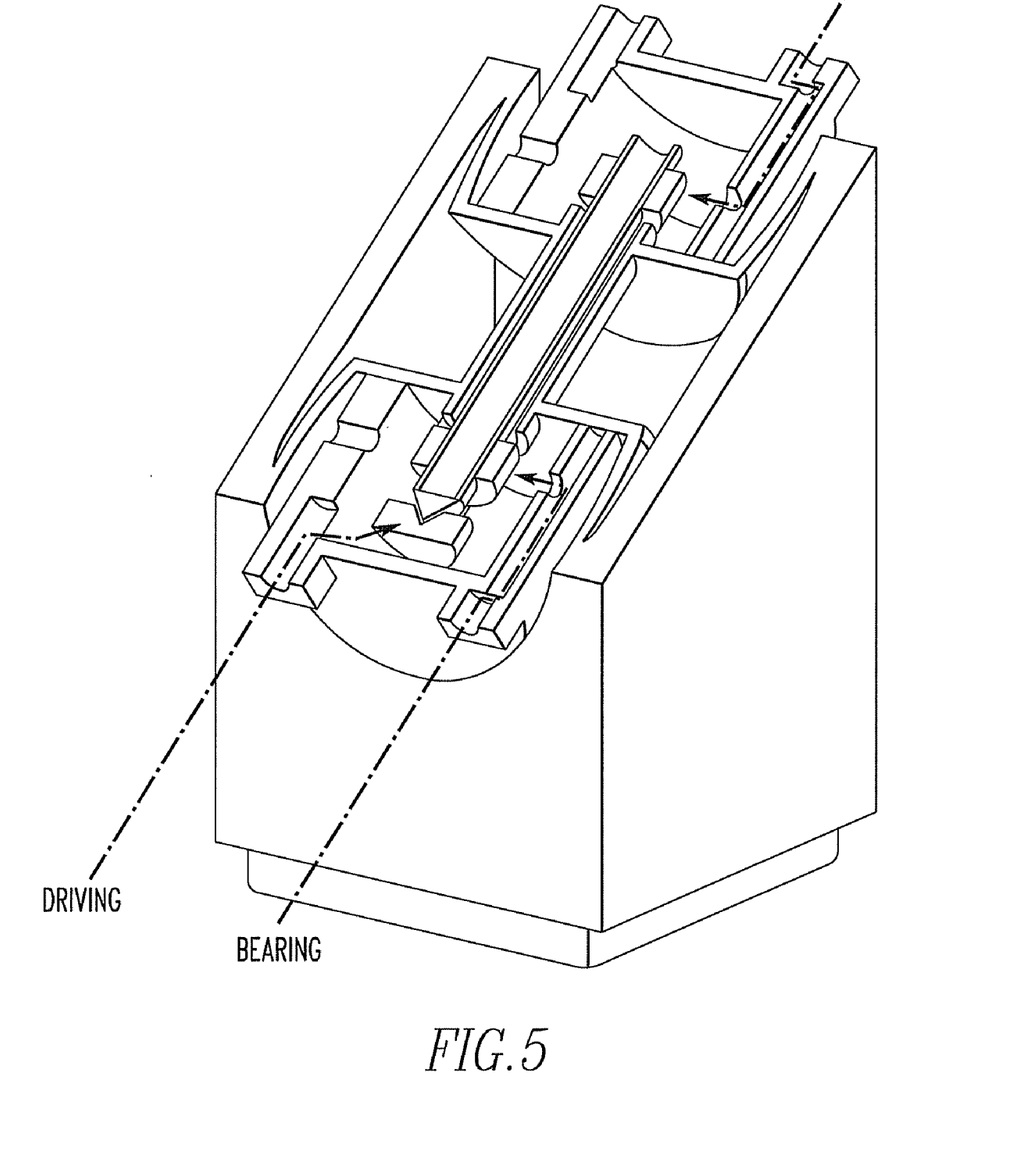
FIG. 5 is a fragmentary enlarged view of the solid-sample, high-resolution NMR probe shown in FIG. 4.

FIG. 5 is a three-dimensional representation of a gas supply system for the sample-rotating system. The arrows indicate gas stream passages used for the bearings and for driving purposes.

The gas for the air bearings for rotating the sample tube and for supply of torque is supplied into the bearing nozzles through the piping inside the support members as shown to permit the sample tube to be rotated at a high speed of about 8 kHz. The temperature of the gas can be varied within a range of from −40° C. to +80° C. The pressure of the gas is equal to the atmospheric pressure to which about 0.5 to 4.0 atm is added.

Figure 6A:
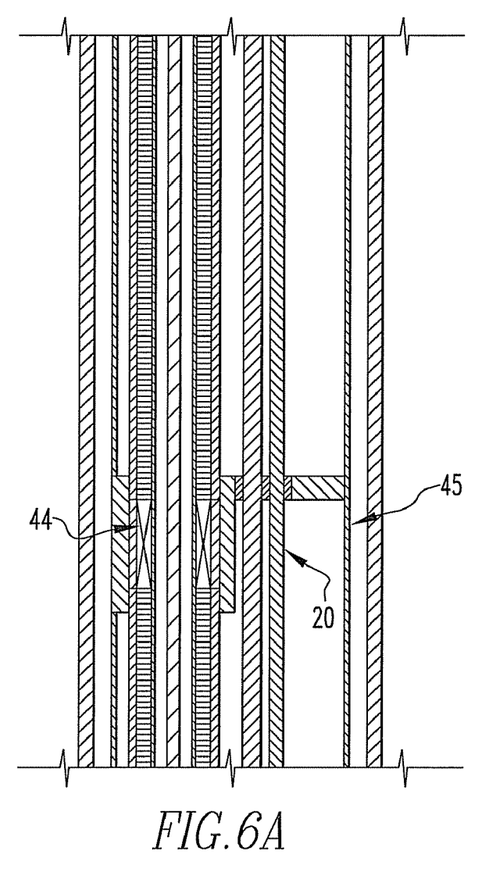
FIGS. 6A and 6B show fragmentary enlarged views of the solid-sample, high-resolution NMR probe shown in FIG. 5.
Figure 6B:
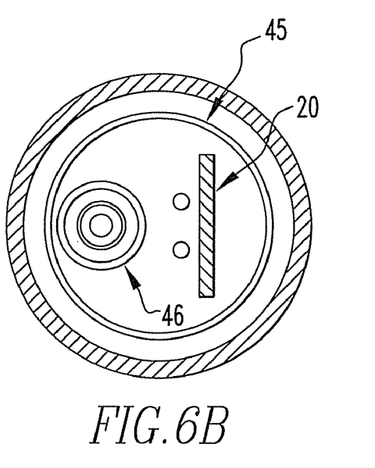

FIGS. 6A and 6B show enlarged views of the relay portion 12 and its vicinities. FIG. 6A is a cross-sectional view as viewed from a lateral direction. FIG. 6B is a cross-sectional view as viewed from above.

A second heat exchanger 44 is an intermediate-temperature heat exchanger through which helium gas vaporized from the liquid helium reservoir 17 in the first heat exchanger 37 is passed when the gas is returned to the outside. As a result, a radiation shield 45 (50 K radiation shield) in thermal contact with the second heat exchanger 44 is cooled by thermal conduction. The radiation shield 45 assumes a temperature of about 50 K. The shield 45 surrounds various parts cooled below 10 K (such as helium gas pipe 46, 4 K stage bar 20 cooling the preamplifier (not shown), first heat exchanger 37 located at the top of the relay portion, and variable capacitor 39). The shield 45 reduces heat radiation from the outside and enhances the efficiency of cooling done by the first heat exchanger 37.

The helium gas pipe 46 is adiabatically designed. That is, the pipe 46 has an innermost tube through which the liquid helium passes. The innermost tube is surrounded by a vacuum layer, which, in turn, is surrounded by an outermost tube through which low-temperature helium gas having undergone heat exchange by the first heat exchanger 37 passes. The pipe 46 has the three tubes coaxially arranged. This enhances the efficiency at which the liquid helium is transported. In FIG. 2, the liquid helium transport pipe 16 and helium gas return pipe 18 correspond to the pipe 46.

The 4 K stage bar 20 cools the preamplifier (not shown). The 4 K stage bar 20 is a metallic thermal conductive member (such as a copper plate) in thermal contact with the first heat exchanger 37. The bar 20 cools a coaxial cable (not shown) interconnecting the detection portion 11 and the preamplifier 22, in addition to the preamplifier 22 in the electrical circuitry 13, as shown in FIG. 2.

Figure 7:
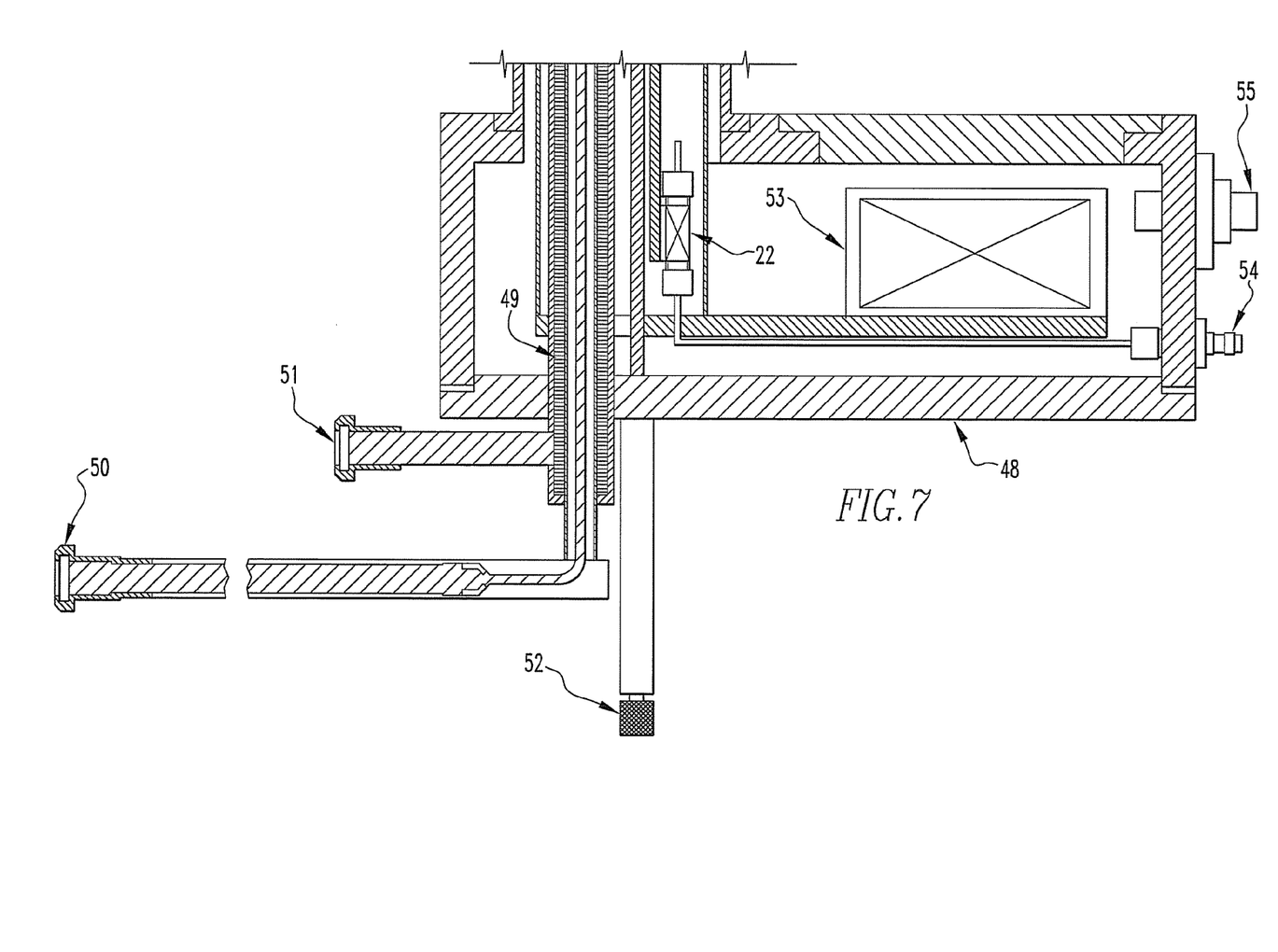
FIG. 7 is a fragmentary enlarged view of the solid-sample, high-resolution NMR probe associated with the present invention.

FIG. 7 is an enlarged view of the portions arranged from the electrical circuitry 13 to the refrigerant inlet-output portion 14. Because these portions are located at the exit of the bore in the superconducting magnet, these portions are spread laterally.

The components 17, 20, 21, 22, 23, 24, 25, 36, 37, 38, 39, 44, 45, and 53 placed in low-temperature conditions are mechanically secured to a bottom plate 48 only via the outermost tube of the helium gas pipe 46. Therefore, inflow of heat due to conduction is suppressed.

An exit gas heater 49 is mounted to prevent dew condensation when the used helium gas is taken out of the probe. A liquid helium inlet 50 is an insertion port in which a transfer tube dedicated for liquid helium is inserted, the transfer tube extending from a dewar of liquid helium. A helium gas exit 51 forms a flange for connection with a helium gas recovery line.

A variable capacitor adjusting knob 52 is used to adjust the electrical capacity of the variable capacitor 39 that is employed to adjust the resonant frequency of the transmit-receive coil 36 mounted over the relay portion 12.

A diode box 53 accommodates electronic parts for switching the mode of operation of the transmit-receive coil 36 between transmission mode and reception mode. The box 53 is screwed to a copper plate extending from the 50 K radiation shield 45. Preferably, the box is cooled to about 50 K. An SMA connector 54 is a coaxial cable for transmission and reception of radio-frequency signals. A vacuum compliant product is used to connect the vacuum chamber in the probe and the atmospheric-pressure outside.

A 25 pin connector 55 is a power feeding connector for supplying power to the preamplifier 22, supplying bias power to the electronic parts accommodated in the diode box 53, and supplying power to a temperature sensor (not shown). A vacuum-compliant product is used as the connector 55 to connect the vacuum chamber in the probe and the atmospheric-pressure outside.

Figure 8A:
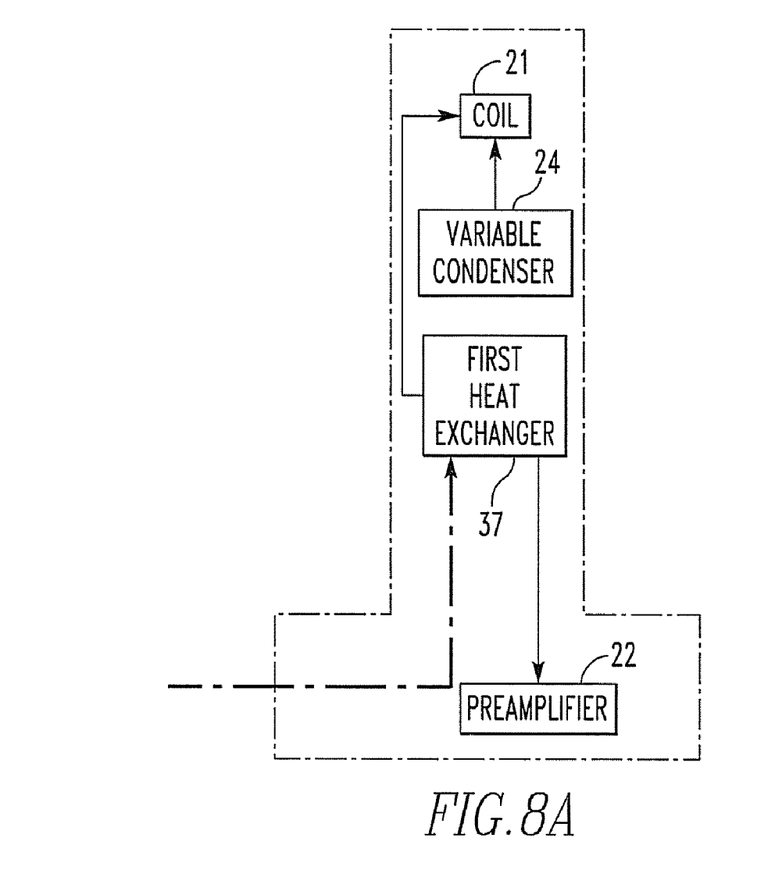
FIGS. 8A and 8B schematically illustrate the operation of a solid-sample, high-resolution NMR probe associated with the present invention.
Figure 8B:
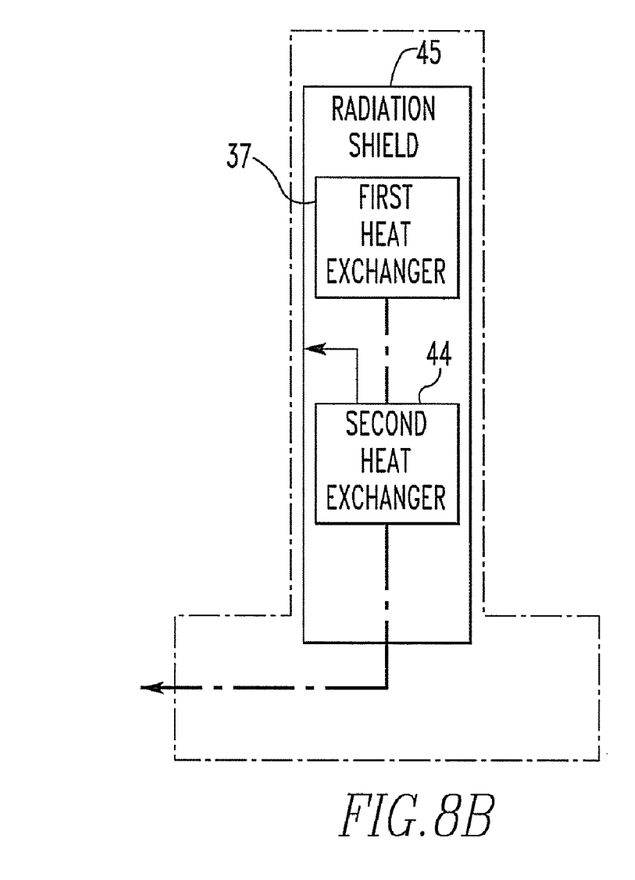

FIGS. 8A and 8B schematically illustrate how the high-resolution, solid-sample probe constructed as described so far operates. FIG. 8A schematically illustrates an operation for transporting liquid helium. FIG. 8B schematically illustrates an operation for returning the liquid helium.

In FIG. 8A, liquid helium is transported toward the top of the probe via an external transfer tube (not shown). The liquid helium is vaporized by the first heat exchanger 37. Heat exchange is performed using the amount of heat taken away (latent heat) at this time. Components associated with the NMR signal detection system, such as transmit-receive coil 36, variable capacitor 39, and preamplifier 22, are cooled down towards 10 K or 5 K.

In FIG. 8B, helium vaporized by heat exchange performed by the first heat exchanger 37 is transported toward the bottom of the probe. Heat exchange is performed by the second heat exchanger 44 using an amount of heat taken away (latent heat) when the low-temperature helium gas becomes hotter. Consequently, the radiation shield 45 is cooled down toward 50 K. The helium gas which has been elevated in temperature by the heat exchange is further heated to prevent dew condensation as the need arises, and is discharged from the probe and recovered.

Embodiment 2

Figure 9:
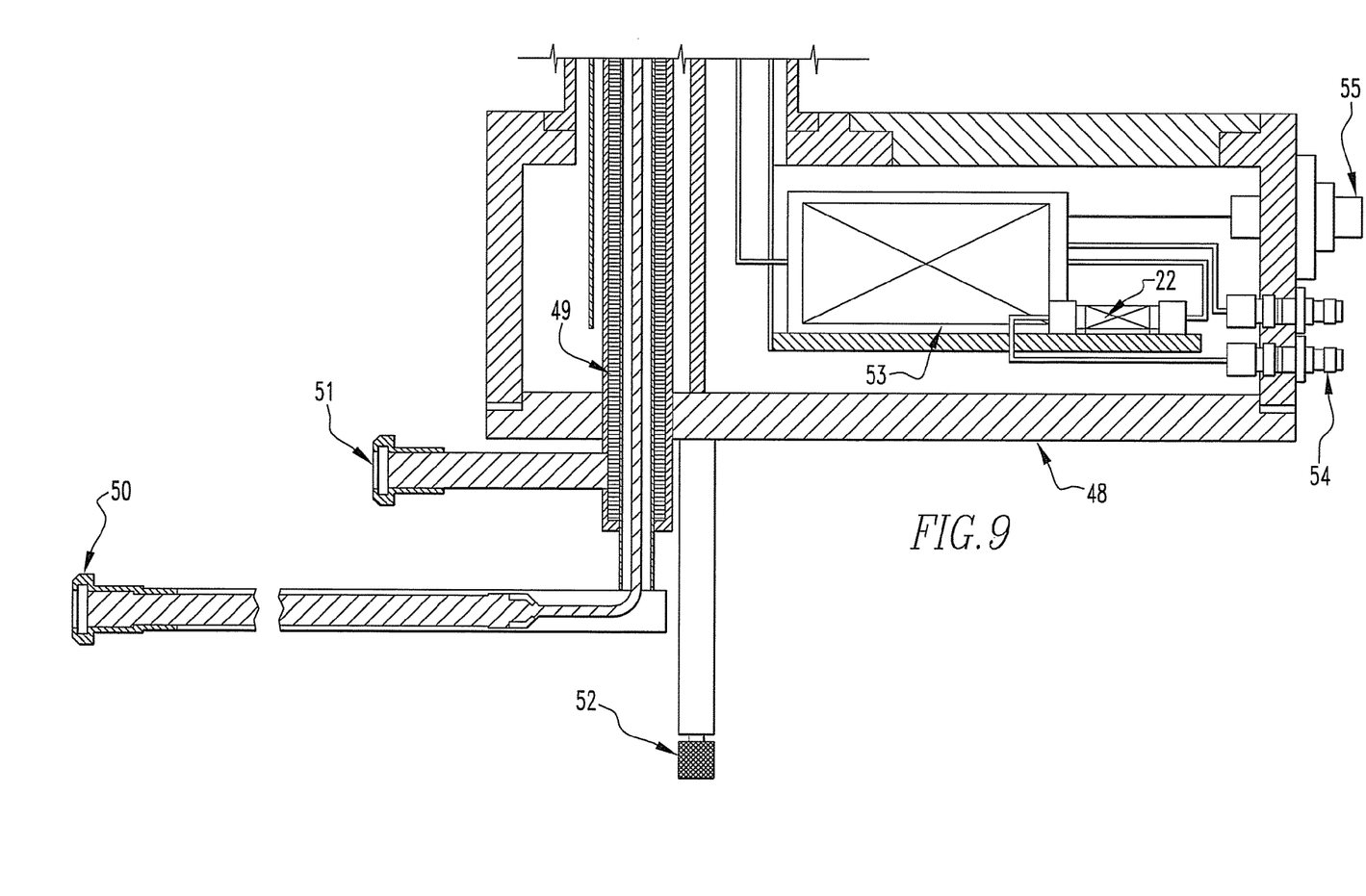
FIG. 9 is a fragmentary enlarged view of a further solid-sample, high-resolution NMR probe associated with the present invention.

FIG. 9 shows another embodiment of the present invention, in which the invention is applied to a solid-sample, high-resolution NMR probe. FIG. 9 is an enlarged view of various portions starting from electrical circuitry 13 and ending with refrigerant inlet portion 14. These portions are located at the exit of the bore (vertical hole) in a superconducting magnet and so are spread laterally, in the same way as in Embodiment 1 described previously in connection with FIGS. 2-7.

In Embodiment 1, the preamplifier 22 is thermally connected to the 4 K stage bar 20 to cool down the preamplifier 22 close to 5 to 10 K. In the present embodiment, however, the preamplifier 22 is held at the same position as the diode box 53. That is, the preamplifier is screwed to a portion of a copper or aluminum plate forming an extension of the 50 K radiation shield 45. The preamplifier is cooled close to the same temperature as the diode box 53, i.e., about 50 K, more preferably below 50 K. We have confirmed that this structure achieves substantially the same sensitivity improvement during solid-sample NMR measurements as in Embodiment 1.

The inventive configuration for cooling the high-resolution NMR probe is simple in structure and can be fabricated at low cost. In addition, it is obvious that the invention can be applied to solution-sample NMR probes, as well as to solid-sample NMR probes described in the above embodiments, by designing the measurement portion for solution NMR measurements.

The present invention will find extensive use in NMR spectroscopy including NMR measurements of solution samples, as well as NMR measurements of solid samples.

Having thus described our invention with the detail and particularity required by the Patent Laws, what is desired protected by Letters Patent is set forth in the following claims.

The invention claimed is:

1. A high-resolution NMR probe comprising:
   a sample portion placed in a normal-temperature, atmospheric-pressure region and placing a sample in a static magnetic field, said sample portion being a sample-rotating system for rotating a sample tube and sample at high speed while tilting it by a magic angle relative to the direction of the static magnetic field;
   a cylindrical partition wall isolated from the normal-temperature, atmospheric-pressure region and having an interior that is maintained in a vacuum;
   a transmit-receive coil placed within the partition wall and acting to irradiate the sample with an RF magnetic field and to receive an NMR signal emanating from the sample after the irradiation such that the NMR signal is detected as an induced electromotive force;
   a preamplifier placed within the partition wall and amplifying the NMR signal detected by the transmit-receive coil;
   a liquid transport tube placed within the partition wall and transporting liquid helium from the outside into vicinities of an NMR measurement portion;
   a first heat exchanger placed within the partition wall and having a liquid helium reservoir for holding the liquid helium transported by the liquid transport tube, the first heat exchanger acting to cool the transmit-receive coil by an amount of heat taken away (latent heat) when the liquid helium held in the liquid helium reservoir evaporates;
   a gas transport tube placed within the partition wall and returning the helium evaporated by the first heat exchanger to the outside from vicinities of the NMR measurement portion;
   a radiation shield placed within the partition wall, surrounding the liquid transport tube and the gas transport tube, and being disposed to block radiation heat coming from the outside; and
   a second heat exchanger placed within the partition wall, mounted in the gas transport tube, and cooling the radiation shield by an amount of heat taken away (latent heat) when the temperature of the evaporated helium rises.

2. A high-resolution NMR probe as set forth in claim 1, wherein said preamplifier is in thermal contact with said heat exchange.

3. A high-resolution NMR probe as set forth in claim 1, wherein said preamplifier is in thermal contact with said second heat exchanger.

4. A high-resolution NMR probe as set forth in claim 1, wherein the partition wall isolating the atmospheric-pressure region from the vacuum region is made of glass fiber-reinforced plastic.

5. A high-resolution NMR probe as set forth in claim 1, wherein said liquid transport tube and said gas transport tube together form a triple tubular structure including an innermost region in which the liquid transport tube is placed, an intermediate region forming a vacuum layer, and an outermost region in which the gas transport tube is placed.

6. A high-resolution NMR probe as set forth in claim 1, wherein said first heat exchanger can cool down below 10 K.

7. A high-resolution NMR probe as set forth in claim 1, wherein said second heat exchanger can cool down to 50 K.

8. A high-resolution NMR probe as set forth in claim 1, wherein said transmit-receive coil is in thermal contact with said first heat exchanger via a flexible heat link.

9. A high-resolution NMR probe as set forth in claim 1, wherein said preamplifier is in thermal contact with said first heat exchanger via a metallic thermal conductive member.

10. A high-resolution NMR probe as set forth in claim 1, wherein said vacuum is at a vacuum level of about $10^{-7}$ Torr at which thermal conduction of gas is not prevalent.

11. A high-resolution NMR probe as set forth in claim 1, in which the sample tube is supported by upper and lower air bearings held by a set of support members.

* * * * *

UNITED STATES PATENT AND TRADEMARK OFFICE
CERTIFICATE OF CORRECTION

PATENT NO. : 8,013,608 B2
APPLICATION NO. : 12/487871
DATED : September 6, 2011
INVENTOR(S) : Kiyonori Takegoshi It is certified that error appears in the above-identified patent and that said Letters Patent is hereby corrected as shown below:

Column 8, Lines 56-57, Claim 2, "heat exchange." should read -- first heat exchanger. --

Column 10, Line 1, Claim 9, "NIVIR probe" should read -- NMR probe --

Signed and Sealed this
Twentieth Day of December, 2011

David J. Kappos
*Director of the United States Patent and Trademark Office*